US011138929B2

(12) United States Patent
Park et al.

(10) Patent No.: US 11,138,929 B2
(45) Date of Patent: Oct. 5, 2021

(54) DISPLAY DEVICE

(71) Applicant: Samsung Display Co., LTD., Yongin-si (KR)

(72) Inventors: Joon Seok Park, Yongin-si (KR); Yeon Keon Moon, Hwaseong-si (KR); Myoung Hwa Kim, Seoul (KR); Tae Sang Kim, Seoul (KR); Hyung Jun Kim, Seoul (KR); Geun Chul Park, Suwon-si (KR); Sang Woo Sohn, Yongin-si (KR); Jun Hyung Lim, Seoul (KR); Kyung Jin Jeon, Incheon (KR); Hye Lim Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/850,775

(22) Filed: Apr. 16, 2020

(65) Prior Publication Data

US 2021/0056898 A1 Feb. 25, 2021

(30) Foreign Application Priority Data

Aug. 19, 2019 (KR) ........................ 10-2019-0100865

(51) Int. Cl.
*G09G 3/3225* (2016.01)
*G09G 3/3275* (2016.01)
(Continued)

(52) U.S. Cl.
CPC ......... *G09G 3/3225* (2013.01); *G09G 3/3266* (2013.01); *G09G 3/3275* (2013.01);
(Continued)

(58) Field of Classification Search
CPC . G09G 3/3255; H01L 27/1225; H01L 27/326; H01L 27/3265; H01L 27/02164
See application file for complete search history.

(56) References Cited

U.S. PATENT DOCUMENTS 6,777,716 B1 8/2004 Yamazaki et al.
2013/0320334 A1* 12/2013 Yamazaki ......... H01L 21/02164
257/43
(Continued)

FOREIGN PATENT DOCUMENTS

KR 10-2014-0102043 8/2014
KR 10-2016-0066681 6/2016
(Continued)

OTHER PUBLICATIONS

Rongsheng Chen et al., "Self-aligned top-gate InGaZnO thin film transistors using SiO2/Al2O3 stack gate dielectric", Thin Solid Films, Sep. 17, 2013, pp. 572-575, vol. 548, Elsevier B. V.

*Primary Examiner* — Kevin M Nguyen
(74) *Attorney, Agent, or Firm* — Kile Park Reed & Houtteman PLLC

(57) ABSTRACT

A display device includes a pixel including a light emitting element connected to a scan line and a data line; a driving transistor that controls a driving current supplied to the light emitting element according to a data voltage applied from the data line. The driving transistor includes a first semiconductor layer, and a first gate electrode disposed on the first semiconductor layer. The display device includes a switching transistor that applies the data voltage to the driving transistor according to a scan signal applied to the scan line. The switching transistor includes a second semiconductor layer, and a second gate electrode disposed on the second semiconductor layer. The display device includes a light blocking layer and a first buffer layer disposed at a lower portion of the driving transistor. The light blocking layer and the first buffer layer do not overlap the switching transistor.

23 Claims, 17 Drawing Sheets

(51) Int. Cl.
  *H01L 27/32*     (2006.01)
  *G09G 3/3266*    (2016.01)
  *H01L 29/66*     (2006.01)
  *H01L 27/12*     (2006.01)
  *H01L 29/417*    (2006.01)
  *H01L 29/786*    (2006.01)
  *H01L 21/02*     (2006.01)

(52) U.S. Cl.
  CPC ...... *H01L 27/3262* (2013.01); *H01L 27/3272* (2013.01); *H01L 27/3276* (2013.01); *G09G 2300/0426* (2013.01); *H01L 21/02488* (2013.01); *H01L 21/02565* (2013.01); *H01L 27/124* (2013.01); *H01L 27/127* (2013.01); *H01L 27/1225* (2013.01); *H01L 29/41733* (2013.01); *H01L 29/66969* (2013.01); *H01L 29/7869* (2013.01); *H01L 29/78603* (2013.01); *H01L 29/78633* (2013.01); *H01L 2227/323* (2013.01)

(56) References Cited

U.S. PATENT DOCUMENTS

2019/0189722 A1* 6/2019 Lim .................... H01L 27/3265
2019/0207140 A1* 7/2019 Lee ...................... H01L 27/326
2020/0212145 A1* 7/2020 Kim .................... H01L 27/3211

FOREIGN PATENT DOCUMENTS

KR   10-2018-0069974    6/2018
KR   10-2019-0061823    6/2019

* cited by examiner

DRT: 210, 310, 410, 511, 513
SCT: 330, 430, 531, 533

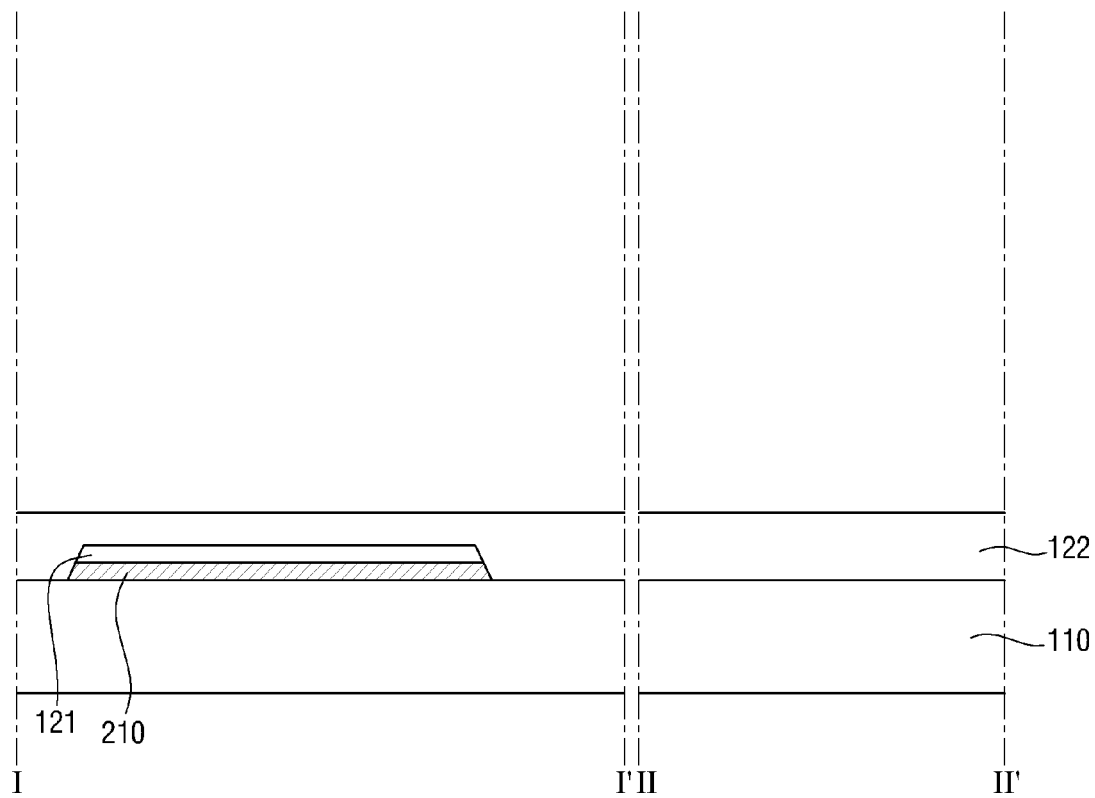
FIG. 11
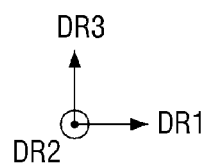

300: 310, 330

DRT: 210, 310, 410, 511, 513
SCT: 330, 430, 531, 533

DISPLAY DEVICE

CROSS REFERENCE TO RELATED APPLICATION(S)

This application claims priority to and benefits of Korean Patent Application No. 10-2019-0100865 under 35 U.S.C. § 119, filed in the Korean Intellectual Property Office on Aug. 19, 2019, the entire contents of which are incorporated herein by reference.

BACKGROUND

1. Field of the Disclosure

The disclosure relates to a display device.

2. Description of the Related Art

The importance of display devices is increasing with the proliferation of multimedia. Accordingly, various display devices such as an organic light emitting display device (OLED), a liquid crystal display device (LCD), and the like are now in use.

An example device for displaying an image includes a display panel such as an organic light emitting display panel or a liquid crystal display panel. As a light emitting display panel, the display device may include a light emitting element. For example, a light emitting diode (LED) may include an organic light emitting diode (OLED) that uses an organic material as a fluorescent material, an inorganic light emitting diode that uses an inorganic material as a fluorescent material, or the like.

The display device includes a display panel, a gate driving circuit, a data driving circuit, and a timing controller. The display panel includes data lines, gate lines, and pixels formed at intersections of the data lines and the gate lines. Each of the pixels receives a data voltage from the data line in case that a gate signal is supplied to the gate line using a thin film transistor as a switching element. Each of the pixels may emit light with a predetermined brightness according to the data voltages.

Recently, display devices capable of higher and higher resolutions have been released. For example, a display device capable of displaying an image at a high resolution of ultra high definition (UHD) has been released, and a display device capable of displaying an image at a high resolution of 8K UHD has been developed. UHD refers to a resolution of 3840×2160, and 8K UHD refers to a resolution of 7680×4320.

In the case of a high resolution display device, as the number of pixels increases, a driving current of each of the pixels may decrease, and accordingly, a range of the driving voltage of a driving transistor of each of the pixels may decrease.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is directed to providing a display device capable of improving the positive bias stress reliability of a driving transistor, and minimizing a channel length of a switching transistor.

Problems in the disclosure are not limited to the above-described problems, and other technical problems which are not mentioned may be clearly understood by those skilled in the art from the specification and the accompanying drawings.

An embodiment of a display device may include a pixel including a light emitting element connected to a scan line and a data line which crosses the scan line, and a driving transistor that may control a driving current supplied to the light emitting element according to a data voltage applied from the data line. The driving transistor may include a first semiconductor layer, and a first gate electrode disposed on the first semiconductor layer. The display device may include a switching transistor that may apply the data voltage to the driving transistor according to a scan signal applied to the scan line. The switching transistor may include a second semiconductor layer, and a second gate electrode disposed on the second semiconductor layer. The display device may include a light blocking layer and a first buffer layer disposed at a lower portion of the driving transistor. The light blocking layer and the first buffer layer may not overlap the switching transistor.

A side surface of the light blocking layer and a side surface of the first buffer layer may be aligned. A width of the light blocking layer and a width of the first buffer layer may be substantially the same.

The display device may include an insulation layer disposed on the first gate electrode and the second gate electrode. The driving transistor may include a first source electrode and a first drain electrode disposed on the insulation layer. The first source electrode may be electrically connected to the light blocking layer.

The first source electrode may contact the light blocking layer through a contact hole passing through the insulation layer and the first buffer layer. The switching transistor may include a second source electrode and a second drain electrode disposed on the second gate electrode. The first source electrode and the second source electrode may be disposed in a same layer.

The first semiconductor layer may include a first conductive area, a second conductive area, and a channel area disposed between the first conductive area and the second conductive area. The first source electrode may contact the first conductive area through a first contact hole passing through the insulation layer. The first drain electrode may contact the second conductive area through a second contact hole passing through the insulation layer.

The first buffer layer may overlap the first semiconductor layer, and may not overlap the second semiconductor layer.

The first semiconductor layer and the second semiconductor layer may include at least one selected from the group consisting of indium (In), gallium (Ga), zinc (Zn), tin (Sn), and hafnium (Hf).

The display device may include a second buffer layer disposed on the first buffer layer. The second buffer layer may be continuously disposed at lower portions of the driving transistor and the switching transistor.

A hydrogen content of the first buffer layer may be higher than a hydrogen content of the second buffer layer.

An embodiment of a display device may include a substrate including a display area and a non-display area, a light blocking layer disposed in the display area of the substrate, a first buffer layer disposed on the light blocking layer, and a second buffer layer disposed on the first buffer layer. The display device may include a first semiconductor layer and a second semiconductor layer disposed on the second buffer layer, a first gate electrode disposed on the first semiconductor layer, and a second gate electrode disposed on the second semiconductor layer. The light blocking layer and the first buffer layer may overlap the first semiconductor layer, and may not overlap the second semiconductor layer.

A side surface of the light blocking layer and a side surface of the first buffer layer may be aligned. The second buffer layer may contact the side surface of the light blocking layer and the side surface of the first buffer layer. The second buffer layer may be continuously disposed on the substrate. A hydrogen content of the first buffer layer may be higher than a hydrogen content of the second buffer layer.

The first buffer layer may include at least one of a silicon nitride layer (SiNx) and a silicon oxynitride layer (SiON). The second buffer layer may include a silicon oxide layer (SiOx). The first semiconductor layer and the second semiconductor layer includes at least one selected from the group consisting of indium (In), gallium (Ga), zinc (Zn), tin (Sn), and hafnium (Hf).

The display device may include a first source electrode disposed on the first gate electrode, and a second source electrode disposed on the second gate electrode. The first source electrode may be electrically connected to the first semiconductor layer, and the second source electrode may be electrically connected to the second semiconductor layer.

This display device may include an insulation layer disposed on the first gate electrode and the second gate electrode. The first source electrode may contact a conductive area of the first semiconductor layer through a contact hole passing through the insulation layer. The second source electrode may contact a conductive area of the second semiconductor layer through another contact hole passing through the insulation layer.

The first source electrode may be electrically connected to the light blocking layer. The first source electrode may contact the light blocking layer through a contact hole passing through the first buffer layer and the second buffer layer.

In a display device according to one embodiment, the positive bias stress reliability of a driving transistor can be improved by disposing a first buffer layer having a relatively high hydrogen content at a lower portion of the driving transistor.

Further, a channel length of a switching transistor can be minimized by disposing only a second buffer layer having a relatively low hydrogen content at a lower portion of the switching transistor. Accordingly, since a degree of design freedom can be secured, a high resolution display device can be implemented. Further, since a circuit area of the switching transistor can be reduced, a dead space of the display device can be minimized.

Effects according to the disclosure are not limited by the above-described examples, and additional effects may be included in the disclosure.

BRIEF DESCRIPTION OF THE DRAWINGS

The above and other aspects and features of the disclosure will become more apparent by describing exemplary embodiments thereof in detail with reference to the attached drawings, in which:

FIGS. 8 to 17 are schematic cross-sectional views illustrating a part of a process of manufacturing the display device in FIG. 7.

DETAILED DESCRIPTION OF THE EMBODIMENTS

Figure 1:
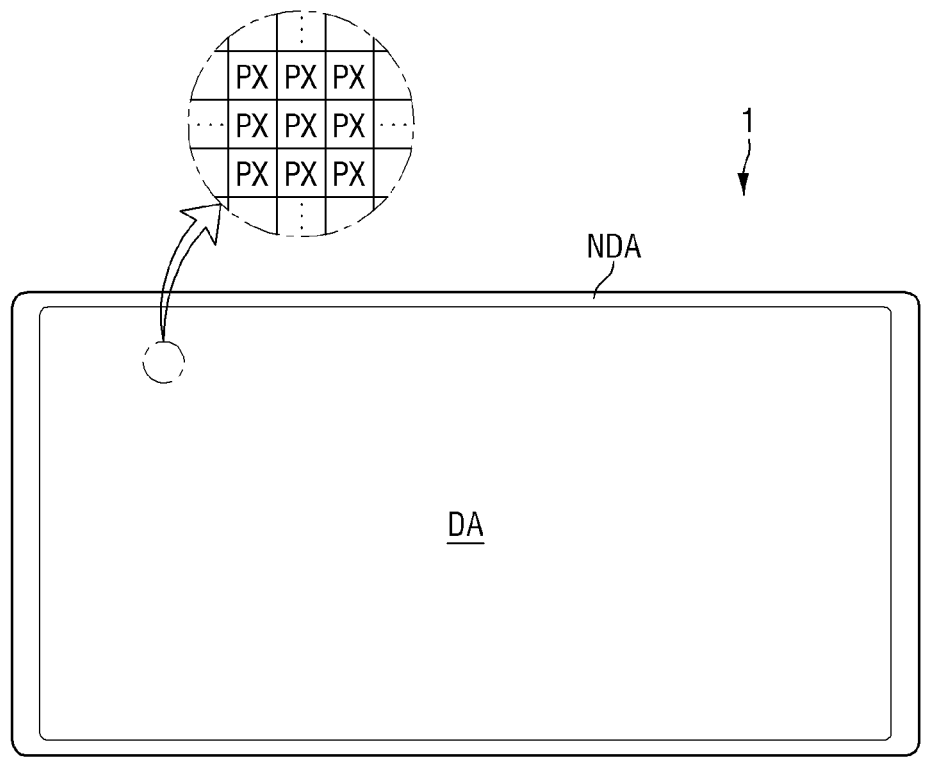
FIG. 1 is a schematic perspective view illustrating a display device according to one embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (e.g., rotated 90 degrees or at other orientations) and the spatially relative descriptors used herein interpreted accordingly.

The terms "overlap" or "overlapping" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The expression "do not overlap" may include "apart from" or "set aside from" or "offset from" and any other suitable equivalents as would be appreciated and understood by those of ordinary skill in the art.

The expression "dead space" may be understood as a space which is devoted to accommodating one or more components that, either singularly or plurally, perform an intended function.

The expression "substantially the same" may include "equal" and "about equal". "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

The phrase "at least one of is intended to include the meaning of" at least one selected from the group of for the purpose of its meaning and interpretation. For example, "at least one of A and B" may be understood to mean "A, B, or A and B."

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The same reference numbers indicate the same components throughout the specification.

FIG. 1 is a schematic perspective view illustrating a display device according to one embodiment.

Referring to FIG. 1, a display device 1 may display a video or a still image. The display device 1 may refer to any electronic device providing a display screen. For example, the display device 1 may include a television, a notebook, a monitor, a billboard, an internet of things device, a mobile phone, a smart phone, a tablet PC, an electronic watch, a smart watch, a watch phone, a head mounted display, a mobile communication terminal, an electronic notebook, an electronic book, a portable multimedia player (PMP), a navigation device, a game console, a digital camera, a camcorder, and the like.

The display device 1 may include a display panel providing a display screen. A light emitting diode (LED) display panel, an organic light emitting diode (OLED) display panel, a quantum dot light emitting display panel, a plasma display panel, a field emission display panel, and the like may be examples of a display panel. Hereinafter, although a case is illustrated in which a display panel may be embodied as an LED display panel, the disclosure is not limited thereto and alternative display panel embodiments are considered to be within the scope of the disclosure.

A shape of the display device 1 may be variously changed. For example, the display device 1 may have shapes such as a rectangular shape of which lateral sides may be long, a rectangular shape of which longitudinal sides may be long, a square shape, a quadrangular shape of which corner portions (vertexes) may be round, other polygonal shapes, a circular shape, and the like. A shape of a display area DA of the display device 1 may also be similar to an overall shape of the display device 1. In FIG. 1, the display device 1 having a rectangular shape of which lateral sides may be long and the display area DA are illustrated.

The display device 1 may include the display area DA and a non-display area NDA. The display area DA may be an area in which an image may be displayed, and the non-display area NDA may be an area in which an image may not be displayed. The display area DA may be referred to as an active area, and the non-display area NDA may be referred to as an inactive area.

The display area DA may substantially occupy a center of the display device 1. The display area DA may include pixels PX. The pixels PX may be arranged in a matrix form. A shape of each of the pixel PX may be a rectangular shape or a square shape in the plan view, but is not limited thereto. For example, a shape of a pixel may be a rhombus shape of which sides may be inclined with respect to a first direction DR1.

Figure 2:
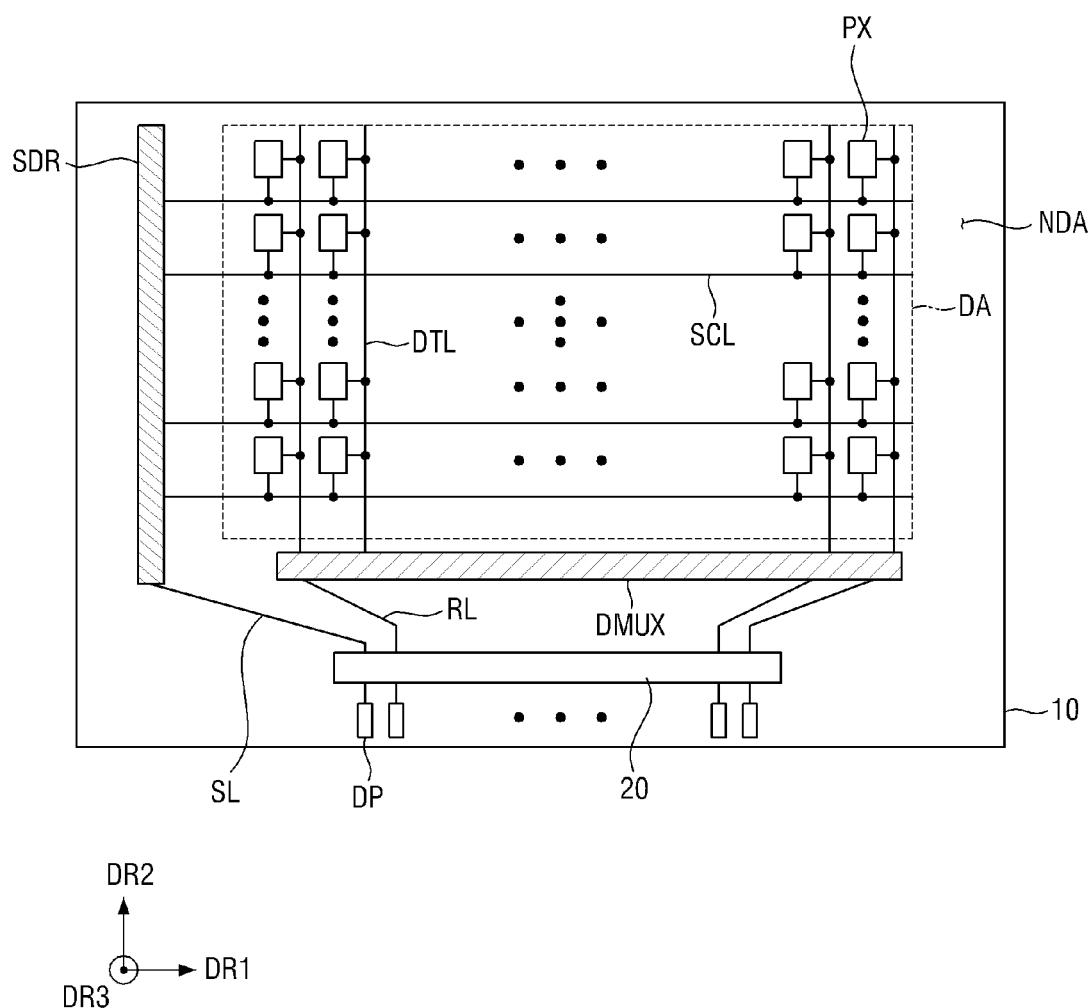
FIG. 2 is a schematic plan view of the display device according to one embodiment.

FIG. 2 is a schematic plan view of the display device according to one embodiment.

Referring to FIG. 2, the display device 1 may include a display panel 10, an integrated driver 20, and a scan driver SDR. The integrated driver 20 may include a timing controller and a data driver.

The display panel 10 may include the display area DA in which the pixels PX may be formed to display an image, and the non-display area NDA which may be a peripheral area of the display area DA. In an embodiment, the display panel 10 may include a curved surface portion, and the display area DA may be disposed in the curved surface portion. The image of the display panel 10 may also be visible in the curved surface portion.

In the display area DA, not only the pixels PX, but also scan lines (SCL1 to SCLk, k may be an integer of two or more), data lines (DTL1 to DTLj, j may be an integer of two or more), and power lines which may be connected to the pixel PX may be disposed. The scan lines SCL may be formed in parallel in the first direction DR1, and the data lines DTL may be formed in parallel in a second direction DR2 which crosses the first direction DR1. Each of the pixels PX may be connected to a scan line SCL and a data line DTL.

Each of the pixels PX may include a driving transistor, a switching transistor, a light emitting element, and a capacitor. Since the switching transistor may be turned on in case that a scan signal is applied from the scan line SCL, a data voltage of the data line DTL may be applied to a gate electrode of the driving transistor. The driving transistor may supply a driving current to the light emitting element according to the data voltage applied to the gate electrode, thereby emitting light. The driving transistor and the switching transistor may be thin film transistors. The light emitting element may emit light according to the driving current of the driving transistor. The light emitting element may be an organic light emitting diode including a first electrode, an organic light emitting layer, and a second electrode. The capacitor may serve to uniformly maintain the data voltage applied to the gate electrode of the driving transistor.

The non-display area NDA may be defined as an area from an outer side of the display area DA to an edge of the display panel 10. In the non-display area NDA, the scan driver SDR may apply scan signals to the scan lines SCL, and a data voltage distribution circuit DMUX connected between the data lines DTL and routing lines RL may be disposed. Further, display pads DP electrically connected to the integrated driver 20 may be disposed in the non-display area NDA. The integrated driver 20 and the display pads DP may be disposed at an edge of the display panel 10.

The integrated driver 20 may be connected to display pads DP to receive digital video data and timing signals. The integrated driver 20 may convert the digital video data to analog positive/negative data voltages and supply the converted analog positive/negative data voltages to the data lines DTL through the routing lines RL and the data voltage distribution circuit DMUX. Further, the integrated driver 20 may generate and supply scan control signals for controlling the scan driver SDR through scan control lines SL. The pixels PX to which the data voltages may be supplied may be selected by the scan signals of the scan driver SDR, and the data voltages may be supplied to the selected pixels PX. Further, the integrated driver 20 may supply power voltages to the power lines.

The integrated driver 20 may be formed as an integrated circuit (IC) and mounted on the display panel 10 in a pad area by a chip on glass (COG) method, a chip on plastic (COP) method, or an ultrasonic bonding method, but is not limited thereto. For example, the integrated driver 20 may be mounted on a separate circuit board.

The display pads DP may be electrically connected to the integrated driver 20. Although not shown in the drawings, the circuit board may be attached onto the pads DP using an anisotropic conductive film. Accordingly, lead lines of the circuit board may be electrically connected to the display pads DP. The circuit board may be a flexible film such as a flexible printed circuit board, a printed circuit board, or a chip on film. The circuit board may be bent in a downward direction from the display panel 10. A side of the circuit board may be attached to one edge of the display panel 10, and another side of the circuit board may be disposed under the display panel 10 to be connected to a system board in which a host system may be mounted.

The scan driver SDR may be connected to the integrated driver 20 and may receive the scan control signals through at least one scan control line SL. The scan driver SDR may generate scan signals according to the scan control signals, and sequentially output the scan signals to the scan lines SCL. Although FIG. 2 illustrates a case in which the scan driver SDR may be formed at one side of the display area DA, for example, in the non-display area NDA at a left side, the disclosure is not limited thereto. For example, the scan driver SDR may be formed at more than one side of the display area DA, for example, in the non-display areas NDA at the left and right sides.

The data voltage distribution circuit DMUX may be connected between the routing lines RL and the data lines DTL. A ratio between the number of routing lines RL connected to the data voltage distribution circuit DMUX and the number of data lines DTL connected to the data voltage distribution circuit DMUX may be 1 to q (q may be an integer of two or more). The data voltage distribution circuit DMUX may serve to distribute the data voltages applied to one routing line RL to multiple data lines DTL.

A power supply circuit may generate voltages necessary to drive the display panel 10 from main power applied from the system board to supply the voltages to the display panel 10. For example, the power supply circuit may generate a first power voltage and a second power voltage for driving light emitting elements EL of the display panel 10 from the main power and respectively supply the first power voltage and the second power voltage to a first voltage line VDD (shown in FIG. 3) and a second voltage line VSS (shown in FIG. 3) of the display panel 10. Further, the power supply circuit may generate and supply driving voltages for driving the integrated driver 20 and the scan driver SDR from the main power.

The power supply circuit may be formed as an integrated circuit and mounted on the circuit board, but is not limited thereto. For example, the power supply circuit may be integrally formed on the integrated driver 20.

Figure 3:
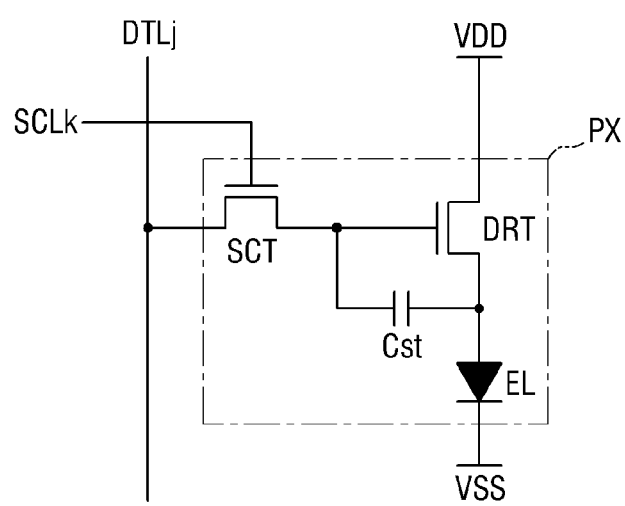
FIG. 3 is a schematic circuit diagram illustrating one pixel in FIG. 2.

FIG. 3 is a schematic circuit diagram illustrating one pixel in FIG. 2 according to a two transistor-one capacitor (2T1C) embodiment.

Referring to FIG. 3, the pixel PX may include a driving transistor DRT, a switching transistor SCT, a light emitting element EL, and a capacitor Cst. FIG. 3 illustrates that each of the pixels PX may have the two transistor-one capacitor (2T1C) structure having one driving transistor DRT, one switching transistor SCT, and one capacitor Cst, but the disclosure is not limited thereto. Each of the pixels PX may include a greater number of transistors and multiple capacitors.

Each of the driving transistor DRT and the switching transistor SCT may include a first electrode, a second electrode, and a gate electrode. One of the first electrode and the second electrode may be a source electrode, and the other one may be a drain electrode.

Each of the driving transistor DRT and the switching transistor SCT may be formed of a thin film transistor. Further, in FIG. 3, each of the driving transistor DRT and the switching transistor SCT may be described as being formed of an N-type metal oxide semiconductor field effect transistor (MOSFET), but are not limited thereto. The driving transistor DRT and/or the switching transistor SCT may be formed of a P-type MOSFET. Locations of the source electrode and the drain electrode of each of the driving transistor DRT and the switching transistor SCT may be changed. Hereinafter, an example in which each of the driving transistor DRT and the switching transistor SCT may be an N-type MOSFET will be described.

The driving transistor DRT may supply a driving current to the light emitting element EL according to the data voltage applied to the gate electrode, thereby emitting light. For example, the driving transistor DRT may be a driving transistor. The gate electrode of the driving transistor DRT may be connected to the source electrode of the switching transistor SCT, the source electrode of the driving transistor DRT may be connected to a first electrode of the light emitting element EL, and the drain electrode of the driving transistor DRT may be connected to the first voltage line VDD to which the first power voltage may be applied.

Since the switching transistor SCT may be turned on in case that a scan signal is applied from the kth (k may be a positive integer) scan line SCLk, a data voltage of the jth (j may be a positive integer) data line DTLj may be applied to the gate electrode of the driving transistor DRT. For example, the switching transistor SCT may be a switching transistor. The gate electrode of the switching transistor SCT may be connected to the kth scan line SCLk, the source electrode of the switching transistor SCT may be connected to the gate electrode of the driving transistor DRT, and the drain electrode of the switching transistor SCT may be connected to the jth data line DTLj.

The capacitor Cst may be connected between the gate electrode and the source electrode of the driving transistor DRT. Accordingly, the capacitor Cst may serve to uniformly maintain the data voltage applied to the gate electrode of the driving transistor DRT.

The light emitting element EL may emit light according to the driving current of the driving transistor DRT. The light emitting element EL may be an organic light emitting diode including a first electrode, an organic light emitting layer, and a second electrode. The first electrode of the light emitting element EL may be connected to the source electrode of the driving transistor DRT and the second electrode of the light emitting element EL may be connected to the second voltage line VSS to which the second power voltage, which may be lower than the first power voltage, may be applied.

Figure 4:
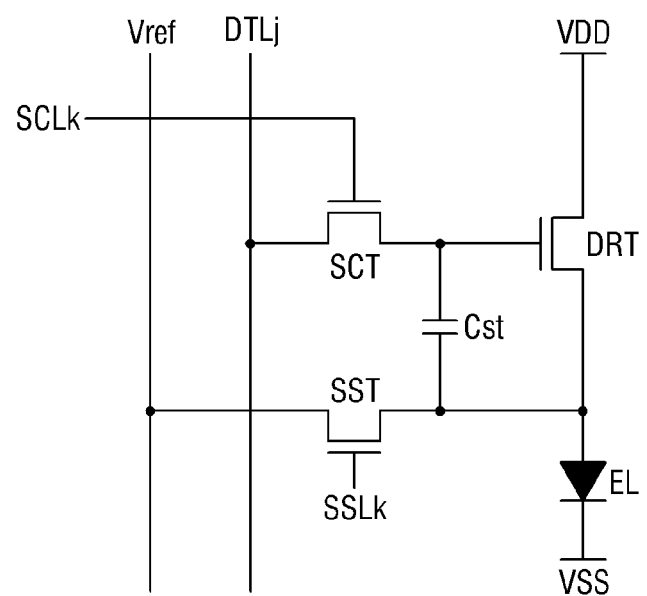
FIG. 4 is a schematic circuit diagram illustrating one pixel in FIG. 2.

FIG. 4 is a schematic circuit diagram illustrating one pixel in FIG. 2 according to a three transistor-one capacitor (3T1C) embodiment.

Referring to FIG. 4, the pixel PX may include a driving transistor DRT, a switching transistor SCT, a sensing transistor SST, a light emitting element EL, and a capacitor Cst. FIG. 4 illustrates that each of the pixels PX may have the three transistor-one capacitor (3T1C) structure having one driving transistor DRT, one switching transistor SCT, one sensing transistor SST, and one capacitor Cst. The circuit diagram in FIG. 4 may be the same as the circuit diagram in FIG. 3 except for further including the sensing transistor SST and a reference line Vref.

The circuit diagram in FIG. 4 may further include a compensation circuit including the sensing transistor SST and the reference line Vref. The compensation circuit may be a circuit added in each of the pixels PX to compensate for a threshold voltage of the driving transistor DRT which may act as a driving transistor.

The sensing transistor SST may be connected between a source electrode of the driving transistor DRT and a first electrode of the light emitting element EL. A gate electrode of the sensing transistor SST may be connected to a kth sensing signal line SSLk, a drain electrode of the sensing transistor SST may be connected to the reference line Vref, and a source electrode of the sensing transistor SST may be connected to one end of the capacitor Cst. The sensing transistor SST may be turned on by a sensing signal of the kth sensing signal line SSLk and may operate to be capable of supplying a reference voltage transferred through the reference line Vref to the source electrode of the driving transistor DRT or sensing a voltage or current of the source electrode of the driving transistor DRT.

The reference line Vref may be connected to the scan driver SDR. The scan driver SDR may sense the source electrode of the driving transistor DRT of each of the pixels PX, and generate a sensing result in real time, during a non-display period of an image, or during an N frame (N may be an integer of one or more) period. The switching transistor SCT which may act as a switching transistor and the sensing transistor SST which may act as a sensing transistor may be turned on at the same time. A sensing operation through the reference line Vref and a data output operation in which a data signal may be output may be separated from each other according to a time division manner of the scan driver SDR.

An object to be compensated for according to the sensing result may be a digital type data signal, an analog type data signal, a gamma signal, or the like. Further, a compensation circuit may generate a compensation signal or the like on the basis of the sensing result may be implemented in the scan driver SDR, in the timing controller, or as a separate circuit.

However, the disclosure is not limited thereto. In FIGS. 3 and 4, although examples of the pixels PX respectively having the 2T1C structure and the 3T1C structure may be described, a greater number of transistors or capacitors may be included. A description thereof will be omitted.

Hereinafter, structures and disposition of the transistors disposed in each of the pixels PX will be described.

Figure 5:
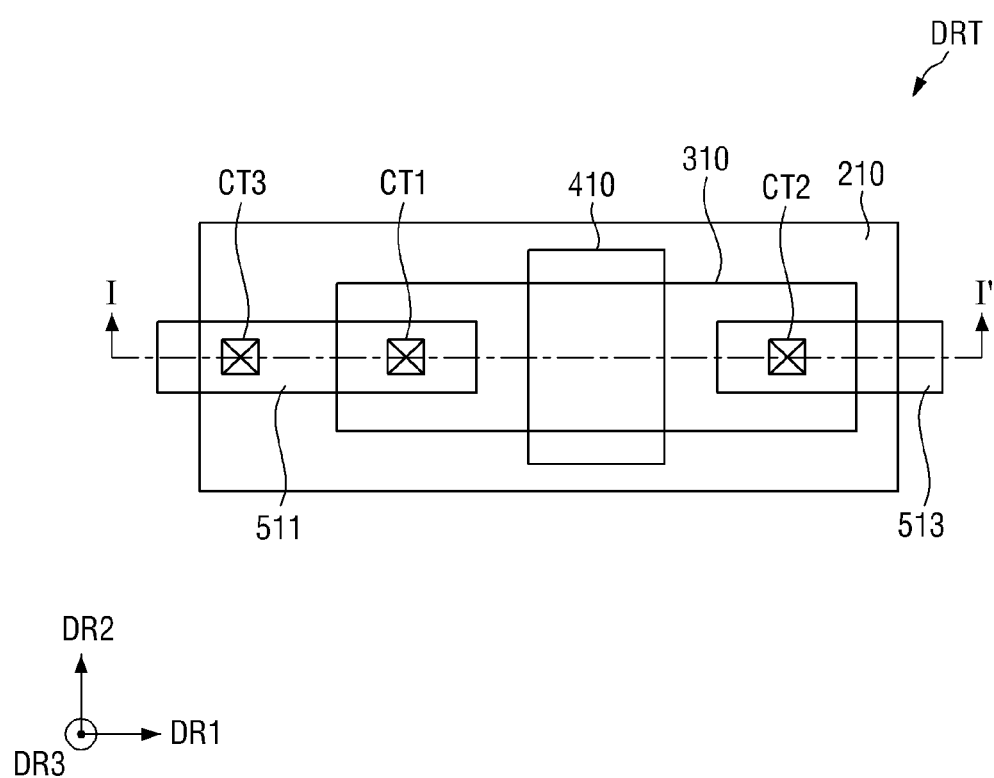
FIG. 5 is a schematic plan view illustrating a driving transistor according to one embodiment.
Figure 6:
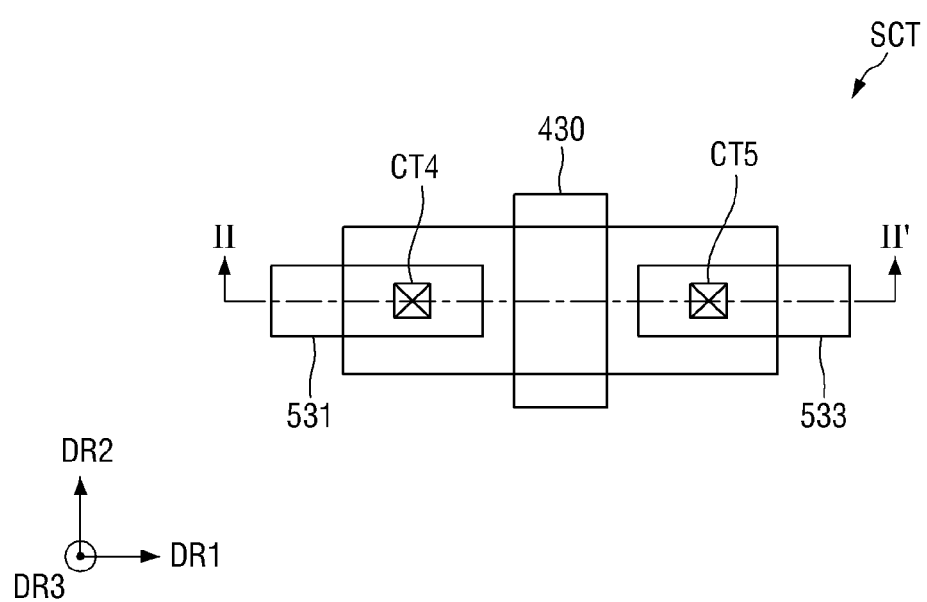
FIG. 6 is a schematic plan view illustrating a switching transistor according to one embodiment.
Figure 7:
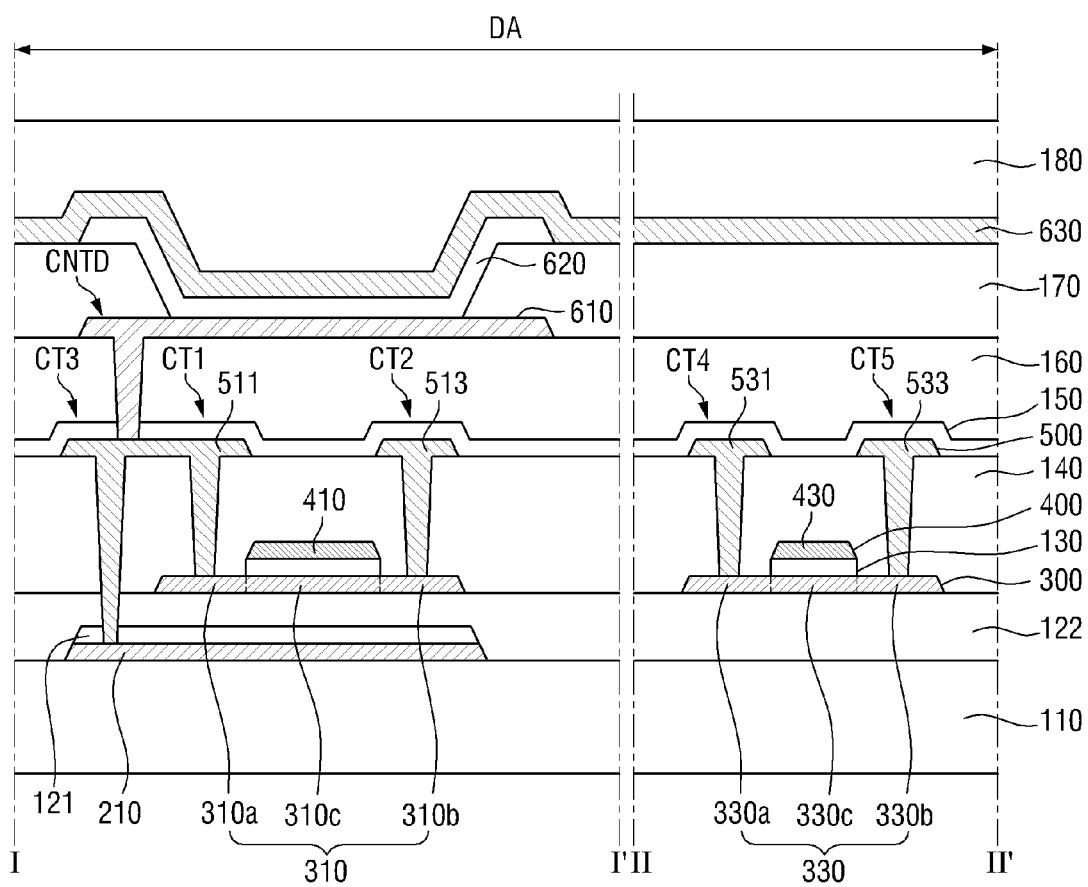
FIG. 7 is a schematic cross-sectional view taken along line I-I' in FIG. 5 and line II-IF in FIG. 6.

FIG. 5 is a schematic plan view illustrating the driving transistor according to one embodiment. FIG. 6 is a schematic plan view illustrating the switching transistor according to one embodiment. FIG. 7 is a schematic cross-sectional view taken along line I-I' in FIG. 5 and line II-IF in FIG. 6.

Referring to FIGS. 5 to 7, the display panel 10 may include conductive layers and insulation layers. The display panel 10 may include a substrate 110, a first buffer layer 121, a second buffer layer 122, a first insulation layer 130, a driving transistor DRT, a switching transistor SCT, a second insulation layer 140, a first passivation layer 150, a third insulation layer 160, a first electrode 610, a light emitting layer 620, a second electrode 630, a pixel definition layer 170, and an encapsulation layer 180.

According to an embodiment, the display device 1 may include the driving transistor DRT and the switching transistor SCT each having a top gate structure in which a gate electrode may be formed on a semiconductor layer. Hereinafter, the driving transistor DRT and the switching transistor SCT will be described in detail.

In the display area DA of the display device 1, the pixels PX may be disposed, and each of the pixels PX may include the driving transistor DRT and the switching transistor SCT. The driving transistor DRT of each pixel PX may include a first semiconductor layer 310, a first gate electrode 410, a first source electrode 511, a first drain electrode 513, and a light blocking layer 210. The switching transistor SCT of the pixel PX may include a second gate electrode 430, a second semiconductor layer 330, a second source electrode 531, and a second drain electrode 533.

The substrate 110 may provide an area in which the driving transistor DRT and the switching transistor SCT may be formed. The substrate 110 may be formed of plastic, glass, or a combination thereof.

A first conductive layer 200 may be disposed on the substrate 110. The first conductive layer 200 may include the light blocking layer 210 of the driving transistor DRT.

The light blocking layer 210 may be disposed on the substrate 110. The light blocking layer 210 may block light reflected from the substrate 110 from being incident on the first semiconductor layer 310. Since the light blocking layer 210 may block the light incident on the first semiconductor layer 310, a leakage current which may flow through the first semiconductor layer 310 may be prevented. To this end, the light blocking layer 210 may at least partially overlap the first semiconductor layer 310. The light blocking layer 210 may be disposed so as not to overlap the switching transistor SCT.

A width of the light blocking layer 210 in the first direction DR1 may be greater than a width of the first semiconductor layer 310 in the first direction DR1. However, the disclosure is not limited thereto, and the light blocking layer 210 may have a width smaller than the width of the first semiconductor layer 310, but at least greater than a width of a channel area 310c of the first semiconductor layer 310. As apparent from the above, the light blocking layer 210 may have a width substantially the same as the width of the first semiconductor layer 310. The light blocking layer 210 may be formed as a single layer or multilayer formed of one of molybdenum (Mo), aluminum (Al), chromium (Cr), gold (Au), titanium (Ti), nickel (Ni), neodymium (Nd), and copper (Cu) or an alloy thereof.

The first buffer layer 121 may be disposed on the light blocking layer 210. The first buffer layer 121 may protect the driving transistor DRT of the pixel PX from moisture which permeates through the substrate 110.

A side surface of the first buffer layer 121 and a side surface of the light blocking layer 210 may be aligned. For example, a width of the first buffer layer 121 in the first direction DR1 may be substantially the same as a width of the light blocking layer 210 in the first direction DR1.

The first buffer layer 121 may be disposed to overlap the driving transistor DRT, and not to overlap the switching transistor SCT. Accordingly, the positive bias stress reliability of the driving transistor DRT may be improved and a channel length of the switching transistor SCT may be minimized.

For example, hydrogen that may be introduced from the first buffer layer 121 may be bonded to a trap site of an interface of the first semiconductor layer 310 of the driving transistor DRT to prevent or minimize electron trapping. For example, the positive bias stress reliability of the driving transistor DRT may be improved. To this end, the first buffer layer 121 may be formed of an inorganic material having a high hydrogen content. For example, the first buffer layer 121 may include at least one inorganic layer of silicon nitride (SiNx) and silicon oxynitride (SiON).

Since the first buffer layer 121 may be disposed so as not to overlap the switching transistor SCT, introduction of the hydrogen from the first buffer layer 121 may be blocked. For example, since carriers of the second semiconductor layer 330 may be prevented from increasing by the hydrogen introduced from the first buffer layer 121, the channel length of the switching transistor SCT may be minimized. Since a circuit area of the switching transistor SCT may be reduced, a degree of design freedom may be secured. For example, a dead space of the display device 1 may be minimized, and high resolution may be implemented.

The second buffer layer 122 may be disposed on the substrate 110 and the first buffer layer 121. The second buffer layer 122 may come into contact (e.g., direct contact) with an upper surface of the first buffer layer 121. Further, the second buffer layer 122 may come into contact (e.g., direct contact) with a side surface of the light blocking layer 210 and a side surface of the first buffer layer 121.

The second buffer layer 122 may be disposed (e.g., continuously disposed) on the substrate 110. For example, the second buffer layer 122 may be disposed (e.g., continuously disposed) at lower portions of the driving transistor DRT and the switching transistor SCT.

The second buffer layer 122 may protect the driving transistor DRT of the pixel PX from moisture which may permeate through the substrate 110.

The second buffer layer 122 may be formed of an inorganic material having a low hydrogen content. For example, the hydrogen content of the second buffer layer 122 may be lower than the hydrogen content of the first buffer layer 121. For example, the second buffer layer 122 may be formed of silicon oxide (SiOx). Since an inorganic layer having a low hydrogen content may be applied to the second buffer layer 122, the introduction of hydrogen into the second semiconductor layer 330 may be minimized. For example, since the carriers of the second semiconductor layer 330 may be prevented from increasing, the channel length of the switching transistor SCT may be minimized.

A semiconductor layer 300 may be disposed on the second buffer layer 122. The semiconductor layer 300 may include the first semiconductor layer 310 of the driving transistor DRT and the second semiconductor layer 330 of the switching transistor SCT.

The first semiconductor layer 310 may be disposed on the second buffer layer 122 to overlap the light blocking layer 210. The first semiconductor layer 310 may include an oxide semiconductor. In an embodiment, the first semiconductor layer 310 may have an oxide including at least one among indium (In), gallium (Ga), zinc (Zn), tin (Sn), and hafnium (Hf). For example, the first semiconductor layer 310 may include indium tin oxide (ITO), indium-tin-gallium oxide (ITGO), indium-gallium-zinc oxide (IGZO) or indium-gallium-zinc-tin oxide (IGZTO). However, the disclosure is not limited thereto.

The first semiconductor layer 310 may include a first conductive area 310a, a second conductive area 310b, and the channel area 310c. The channel area 310c of the first semiconductor layer 310 may be disposed between the first conductive area 310a and the second conductive area 310b. The first conductive area 310a and the second conductive area 310b of the first semiconductor layer 310 may respectively come into contact with the first source electrode 511 and the first drain electrode 513 to be described below.

The second semiconductor layer 330 may be disposed to be spaced apart from the first semiconductor layer 310. The second semiconductor layer 330 may include materials the same as materials constituting the first semiconductor layer 310, or one or more materials selected from materials exemplified as materials constituting the first semiconductor layer 310.

The second semiconductor layer 330 may include a first conductive area 330a, a second conductive area 330b, and a channel area 330c. The channel area 330c of the second semiconductor layer 330 may be disposed between the first conductive area 330a and the second conductive area 330b. The first conductive area 330a and the second conductive area 330b of the second semiconductor layer 330 may respectively come into contact with the second source electrode 531 and the second drain electrode 533 to be described below.

The first semiconductor layer 310 may overlap the first buffer layer 121, and the second semiconductor layer 330 may not overlap the first buffer layer 121. As described above, the positive bias stress reliability of the driving transistor DRT may be improved and the channel length of the switching transistor SCT may be minimized.

The first insulation layer 130 may be disposed on the semiconductor layer 300. The first insulation layer 130 may be disposed on the first semiconductor layer 310 and the second semiconductor layer 330. The first insulation layer 130 may be disposed (e.g., directly disposed) on the first semiconductor layer 310 and the second semiconductor layer 330.

The first insulation layer 130 may be formed of an inorganic material, for example, silicon oxide (SiOx), silicon nitride (SiNx) or a structure thereof (e.g., a stacked structure).

In the drawings, although an example in which the first insulation layer 130 may be disposed between the first gate electrode 410 and the first semiconductor layer 310 and between the second gate electrode 430 and the second semiconductor layer 330 may be described, the disclosure is not limited thereto. For example, the first insulation layer 130 may be formed on upper surfaces and side surfaces of the first semiconductor layer 310 and the second semiconductor layer 330, and may be disposed (e.g., continuously disposed) on the second buffer layer 122.

A second conductive layer 400 may be disposed on the first insulation layer 130. The second conductive layer 400 may include the first gate electrode 410 of the driving transistor DRT and the second gate electrode 430 of the switching transistor SCT.

The first gate electrode 410 may overlap the first semiconductor layer 310 with the first insulation layer 130 therebetween. A width of the first gate electrode 410 in the first direction DR1 may be smaller than a width of the first semiconductor layer 310 in the first direction DR1. However, the disclosure is not limited thereto, and a range of the width of the first gate electrode 410 in the first direction DR1 is not particularly limited as long as the width of the first gate electrode 410 in the first direction DR1 may be a width sufficient for overlapping the channel area 310c of the first semiconductor layer 310.

The first gate electrode 410 may be formed as a single layer or multilayer formed of one of molybdenum (Mo), aluminum (Al), chromium (Cr), gold (Au), titanium (Ti), nickel (Ni), neodymium (Nd), and copper (Cu) or an alloy thereof.

The second gate electrode 430 may overlap the second semiconductor layer 330 with the first insulation layer 130 therebetween. A width of the second gate electrode 430 in the first direction DR1 may be smaller than a width of the second semiconductor layer 330 in the first direction DR1. However, the disclosure is not limited thereto, and a range of the width of the second gate electrode 430 in the first direction DR1 is not particularly limited as long as the width of the second gate electrode 430 in the first direction DR1 may be a width sufficient for overlapping the channel area 330c of the second semiconductor layer 330.

The second gate electrode 430 may include materials the same as materials constituting the first gate electrode 410, or one or more materials selected from materials exemplified as materials constituting the first gate electrode 410.

The second insulation layer 140 may be disposed on the second conductive layer 400. The second insulation layer 140 may include materials the same as materials constituting the first insulation layer 130, or one or more materials selected from materials exemplified as materials constituting the first insulation layer 130.

The second insulation layer 140 may include a first contact hole CT1 that may expose a portion of the upper surface of the first semiconductor layer 310 through the second insulation layer 140 and a second contact hole CT2 that may expose another portion of the upper surface of the first semiconductor layer 310 through the second insulation layer 140. For example, the first contact hole CT1 may be formed to expose the first conductive area 310a of the first semiconductor layer 310, and the second contact hole CT2 may be formed to expose the second conductive area 310b of the first semiconductor layer 310.

Further, the second insulation layer 140, the first buffer layer 121, and the second buffer layer 122 may include a third contact hole CT3 that may expose the light blocking layer 210 through the second insulation layer 140, the first buffer layer 121, and the second buffer layer 122.

The second insulation layer 140 may include a fourth contact hole CT4 that may expose a portion of the upper surface of the second semiconductor layer 330 through the second insulation layer 140 and a fifth contact hole CT5 that may expose another portion of the upper surface of the second semiconductor layer 330 through the second insulation layer 140. For example, the fourth contact hole CT4 may be formed to expose the first conductive area 330a of the second semiconductor layer 330, and the fifth contact hole CT5 may be formed to expose the second conductive area 330b of the second semiconductor layer 330.

A third conductive layer 500 may be disposed on the second insulation layer 140. The third conductive layer 500 may include the first source electrode 511 and the first drain electrode 513 of the driving transistor DRT, and the second source electrode 531 and the second drain electrode 533 of the switching transistor SCT.

The first source electrode 511 and the first drain electrode 513 may be disposed on the first semiconductor layer 310. The first source electrode 511 may come into contact with a side of the first semiconductor layer 310, and the first drain electrode 513 may come into contact with another side of the first semiconductor layer 310. For example, the first source electrode 511 may come into contact with the first conductive area 310a of the first semiconductor layer 310 through the first contact hole CT1, and the first drain electrode 513 may come into contact with the second conductive area 310b of the first semiconductor layer 310 through the second contact hole CT2.

Further, the first source electrode 511 may come into contact with the light blocking layer 210 through the third contact hole CT3. In case that the first source electrode 511 is electrically connected to the light blocking layer 210, the driving transistor DRT may have a smaller slope of a curve in a driving voltage-driving current graph, and may secure a driving voltage of a wide range to drive the light emitting element EL of the pixel PX. For example, the grayscale of the display device 1 may be easily adjusted.

The second source electrode 531 and the second drain electrode 533 may be disposed on the second semiconductor layer 330. The second source electrode 531 may come into contact with a side of the second semiconductor layer 330, and the second drain electrode 533 may come into contact with another side of the second semiconductor layer 330. For example, the second source electrode 531 may come into contact with the first conductive area 330a of the second semiconductor layer 330 through the fourth contact hole CT4, and the second drain electrode 533 may come into contact with the second conductive area 330b of the second semiconductor layer 330 through the fifth contact hole CT5.

The first passivation layer 150 may be disposed on the third conductive layer 500. The first passivation layer 150 may be disposed on the first source electrode 511 and the first drain electrode 513 of the driving transistor DRT, and the second source electrode 531 and the second drain electrode 533 of the switching transistor SCT. The first passivation layer 150 may be formed of an inorganic material, for example, silicon oxide (SiOx), silicon nitride (SiNx) or a structure (e.g., stacked structure) thereof.

The third insulation layer 160 may be disposed on the first passivation layer 150. The third insulation layer 160 may planarize a step height due to thin film transistors such as the driving transistor DRT and the switching transistor SCT. The third insulation layer 160 may be formed of an organic layer such as an acrylic resin, an epoxy resin, a phenolic resin, a polyamide resin, a polyimide resin, or the like, or a combination thereof.

The light emitting element including the first electrode 610, the light emitting layer 620, and the second electrode 630 and the pixel definition layer 170 may be disposed on the third insulation layer 160.

The first electrode 610 may be formed on the third insulation layer 160. The first electrode 610 may be connected to the first source electrode 511 of the driving transistor DRT through an electrode contact hole CNTD that may pass through the first passivation layer 150 and the third insulation layer 160.

In order to partition the pixels, the pixel definition layer 170 may be formed on the third insulation layer 160 to cover edges of the first electrode 610. For example, the pixel definition layer 170 may serve to define the pixels. Here, each of the pixels may represent an area in which the first electrode 610, the light emitting layer 620, and the second electrode 630 may be stacked (e.g., sequentially stacked) and a hole from the first electrode 610 and an electron from the second electrode 630 may be combined with each other in the light emitting layer 620 to emit light.

The light emitting layer 620 may be disposed on the first electrode 610 and the pixel definition layer 170. The light emitting layer 620 may include a hole transporting layer, a light emitting layer, and an electron transporting layer. Further, the light emitting layer 620 may be formed in a tandem structure of two or more stacks, and a charge generation layer may be formed between the stacks.

The second electrode 630 may be formed on the light emitting layer 620. The second electrode 630 may be a common layer commonly formed in the pixels.

The light emitting elements EL may be formed by a top emission method in which light may be emitted in an upward direction. The first electrode 610 may be formed of a metallic material having high reflectivity such as a structure (e.g., stacked structure) of aluminum and titanium (Ti/Al/Ti), a structure (e.g., stacked structure) of aluminum and ITO (ITO/Al/ITO), an APC alloy, and a structure (e.g., stacked structure) of the APC alloy and ITO (ITO/APC/ITO). The APC alloy may be an alloy of silver (Ag), palladium (Pd), and copper (Cu). Further, the second electrode 630 may be formed of a transparent conductive material (TCO) such as ITO or IZO that can transmit light, or a semi-transmissive conductive material such as magnesium (Mg), silver (Ag), or an alloy of magnesium (Mg) and silver (Ag), or a combination thereof. In case that the second electrode 630 is formed of the semi-transmissive conductive material, the light emission efficiency may be improved by a micro cavity.

The encapsulation layer 180 may be disposed on the second electrode 630. The encapsulation layer 180 may prevent the permeation of oxygen or moisture. To this end, the encapsulation layer 180 may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide. Further, the encapsulation layer 180 may include at least one organic layer to prevent foreign substances (particles) from passing through the encapsulation layer 180 and entering the light emitting layer 620 and the second electrode 630. The organic layer may be formed of epoxy, acrylate, urethane acrylate, or a combination thereof.

As described above, in the display device 1 according to the embodiment, the positive bias stress reliability of the driving transistor DRT may be improved by disposing the first buffer layer 121 having a relatively high hydrogen content at the lower portion of the driving transistor DRT. Further, the channel length of the switching transistor SCT may be minimized by disposing the second buffer layer 122 having a relatively low hydrogen content at a lower portion of the switching transistor SCT. For example, the positive bias stress reliability of the driving transistor DRT may be improved, the dead space of the display device 1 may be minimized, and high resolution may be realized.

Further, since the first source electrode 511 and the light blocking layer 210 of the driving transistor DRT may be electrically connected to each other, driving voltages in a wide range may be secured to drive the light emitting element EL of the pixel PX. For example, the grayscale of the display device 1 may be easily adjusted.

The scan driver SDR may also include transistors, and each of the transistors may be formed to be substantially the same as the switching transistor SCT of each of the pixels PX. As described above, the dead space of the display device 1 may be minimized by minimizing a circuit area of the scan driver SDR.

Hereinafter, a method of manufacturing the above-described display device 1 including the driving transistor DRT and the switching transistor SCT will be described.

FIGS. 8 to 17 are schematic cross-sectional views illustrating a part of a process of manufacturing the display device in FIG. 7 according to an embodiment.

Figure 8:
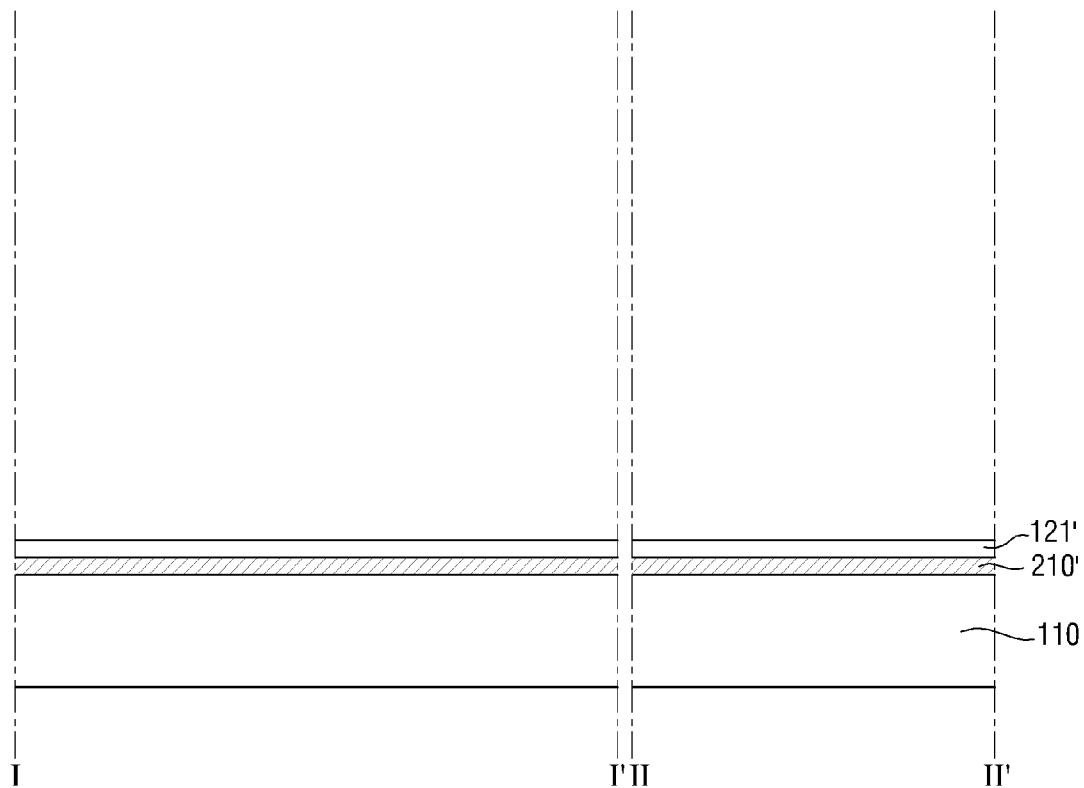
Figure 8:
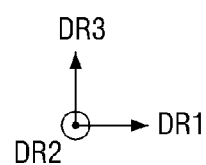

First, referring to FIG. 8, a first metal layer 210' and a first buffer material layer 121' may be formed on a substrate 110.

The first metal layer 210' may be formed on the substrate 110 through a sputtering method, but is not limited thereto. In an embodiment, a process of forming the conductive layers and semiconductor layers is not particularly limited as long as it may involve a typically employed process. Hereinafter, a formation order and structures of the members will be described in detail, and a process of forming the members may be omitted. The first metal layer 210' may form a light blocking layer 210 in a subsequent process.

The first buffer material layer 121' may be formed on a surface (e.g., entire surface) of the first metal layer 210'. The first buffer material layer 121' may be formed through a chemical vapor deposition method, but is not limited thereto. The first buffer material layer 121' may form a first buffer layer 121 in a subsequent process.

Figure 9:
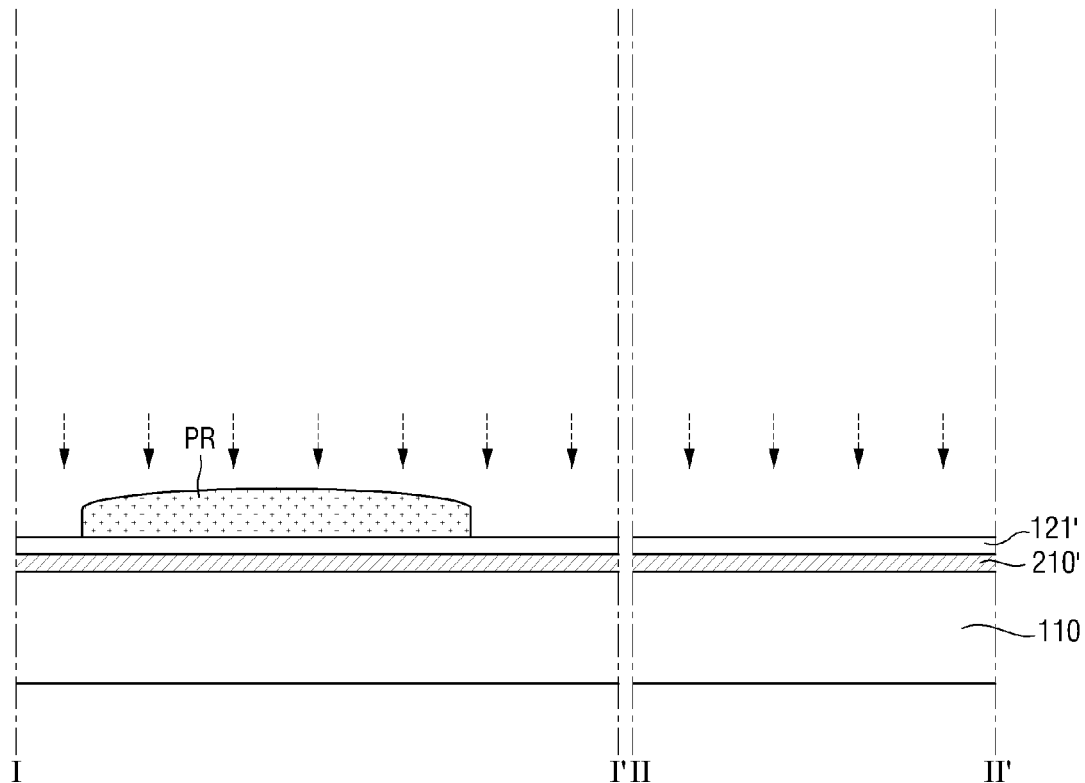
Figure 9:
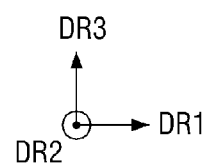

Referring to FIG. 9, a photoresist pattern PR may be formed on the first buffer material layer 121', and the first buffer material layer 121' and the first metal layer 210' may be patterned.

The photoresist pattern PR may perform a function as a mask for forming the first buffer layer 121 and the light blocking layer 210. A width of the photoresist pattern PR in the first direction DR1 may be substantially the same as the width of each of the first buffer layer 121 and the light blocking layer 210 in the first direction DR1.

In case that an etching process in which the first buffer material layer 121' and the first metal layer 210' are etched according to the photoresist pattern PR is performed, the first buffer material layer 121' and the first metal layer 210' may be simultaneously patterned, and may respectively form the first buffer layer 121 and the light blocking layer 210.

Figure 10:
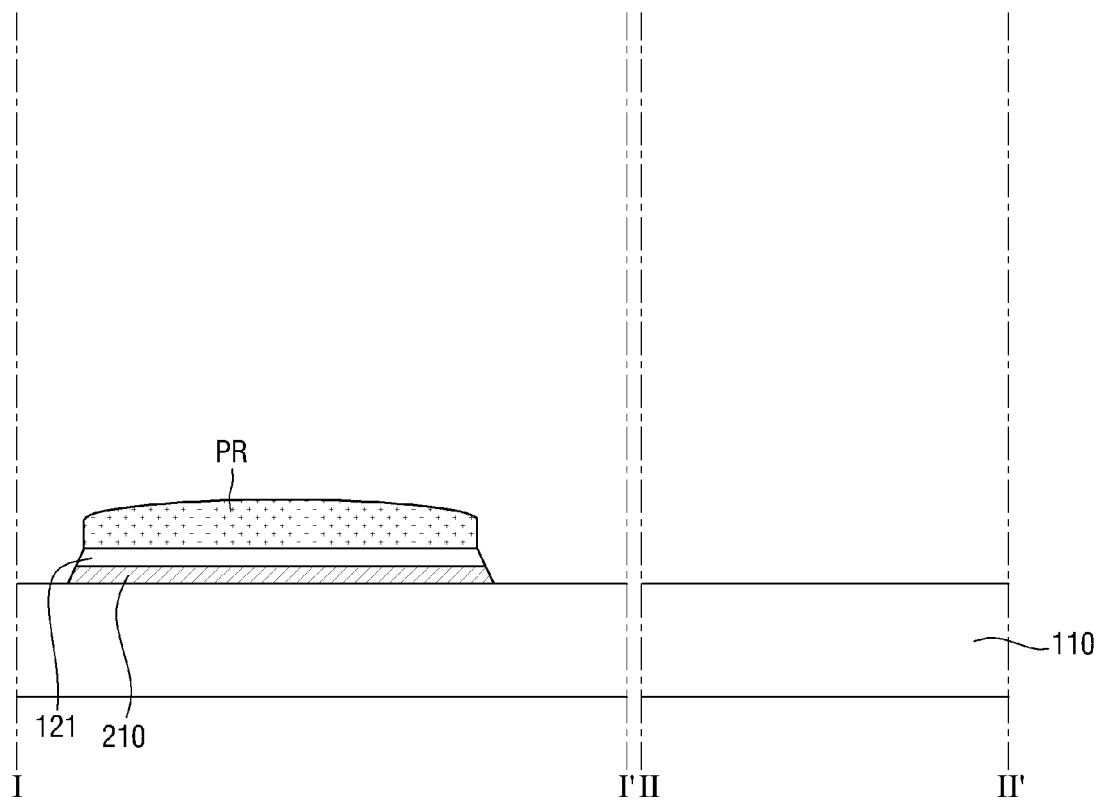

Referring to FIG. 10, the first buffer layer 121 may be formed under the photoresist pattern PR, and the light blocking layer 210 may be formed under the first buffer layer 121.

Referring to FIG. 11, the photoresist pattern PR may be removed, and a second buffer layer 122 may be formed on the first buffer layer 121. The second buffer layer 122 may be formed on a surface (e.g., entire surface) of the substrate 110.

Figure 12:
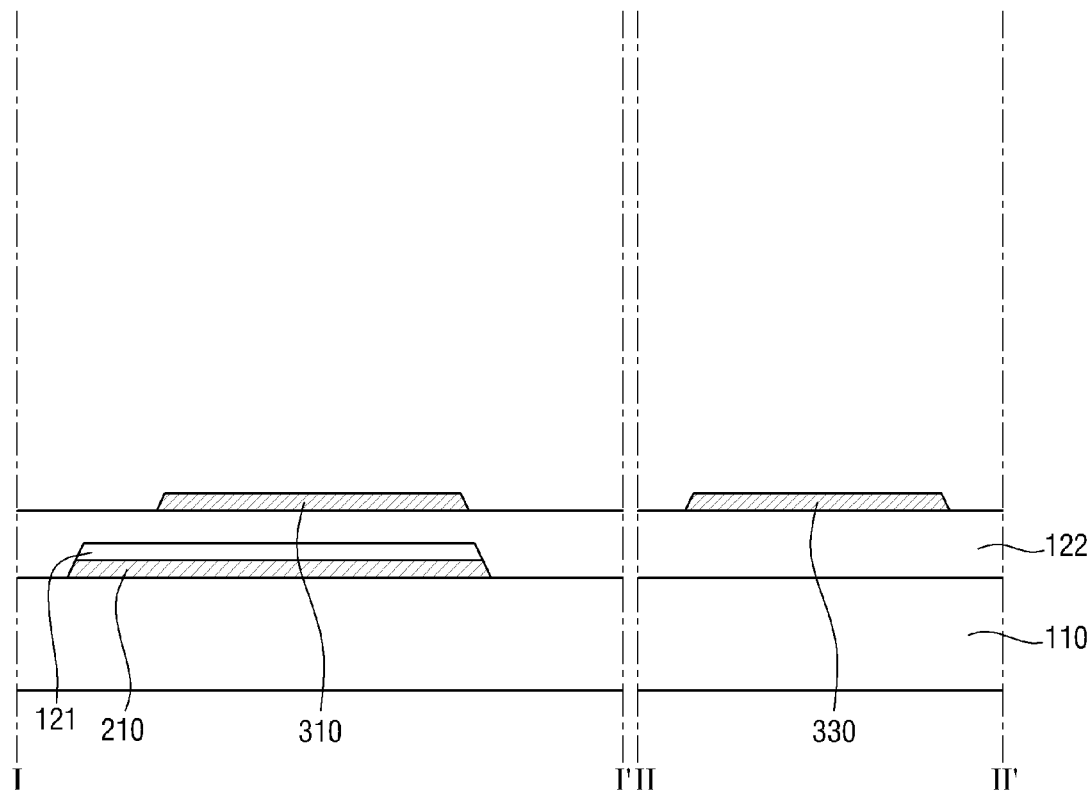
Figure 12:
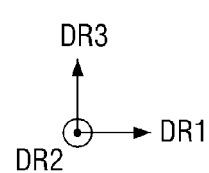

Referring to FIG. 12, a semiconductor layer 300 may be disposed on the second buffer layer 122. The semiconductor layer 300 may include a first semiconductor layer 310 and a second semiconductor layer 330.

The first semiconductor layer 310 may be formed on the second buffer layer 122 to overlap the light blocking layer 210. The first semiconductor layer 310 may be formed by a patterning process using a photoresist after forming one layer through a sputtering method. However, the disclosure is not limited thereto, and in some cases, the first semiconductor layer 310 may be formed by atomic layer deposition.

Figure 13:
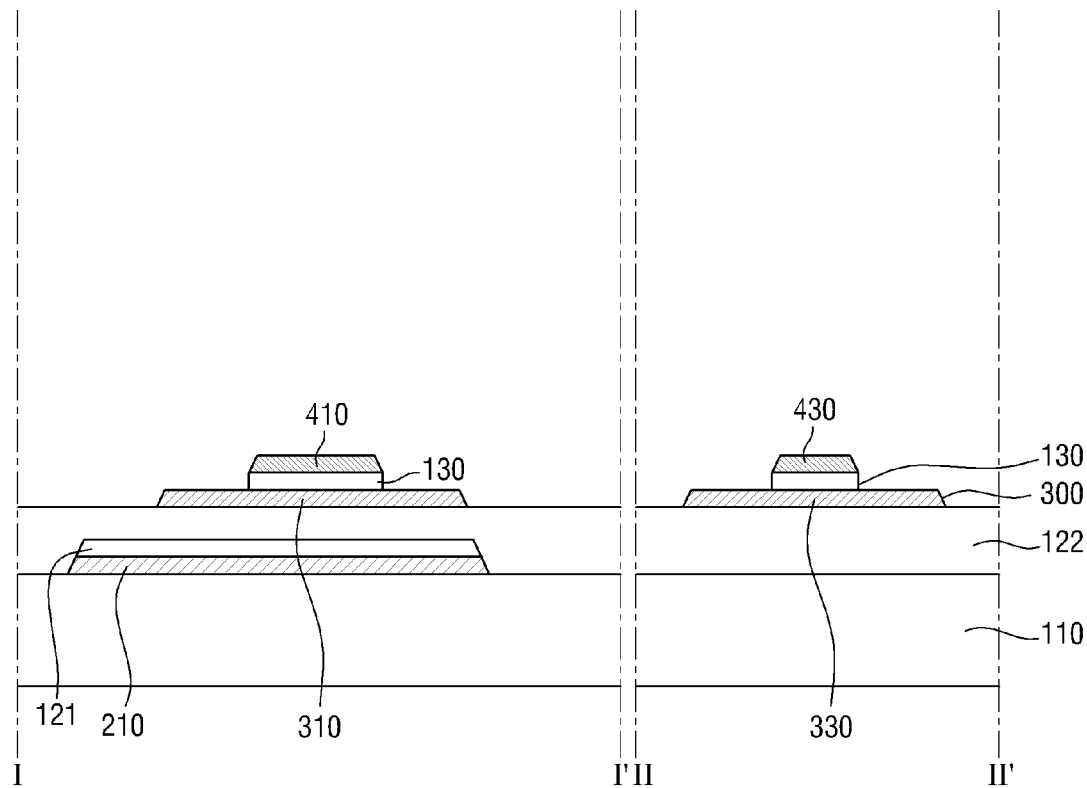
Figure 13:
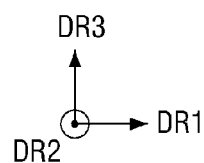

Referring to FIG. 13, a first insulation layer 130 and a second conductive layer 400 may be formed on the semiconductor layer 300. The second conductive layer 400 may include a first gate electrode 410 and a second gate electrode 430.

The first insulation layer 130 and the second conductive layer 400 may be formed by simultaneously patterning an insulation material layer formed by chemical vapor deposition and a metal layer formed by sputtering using an etching process using a photoresist pattern, but is not limited thereto.

Figure 14:
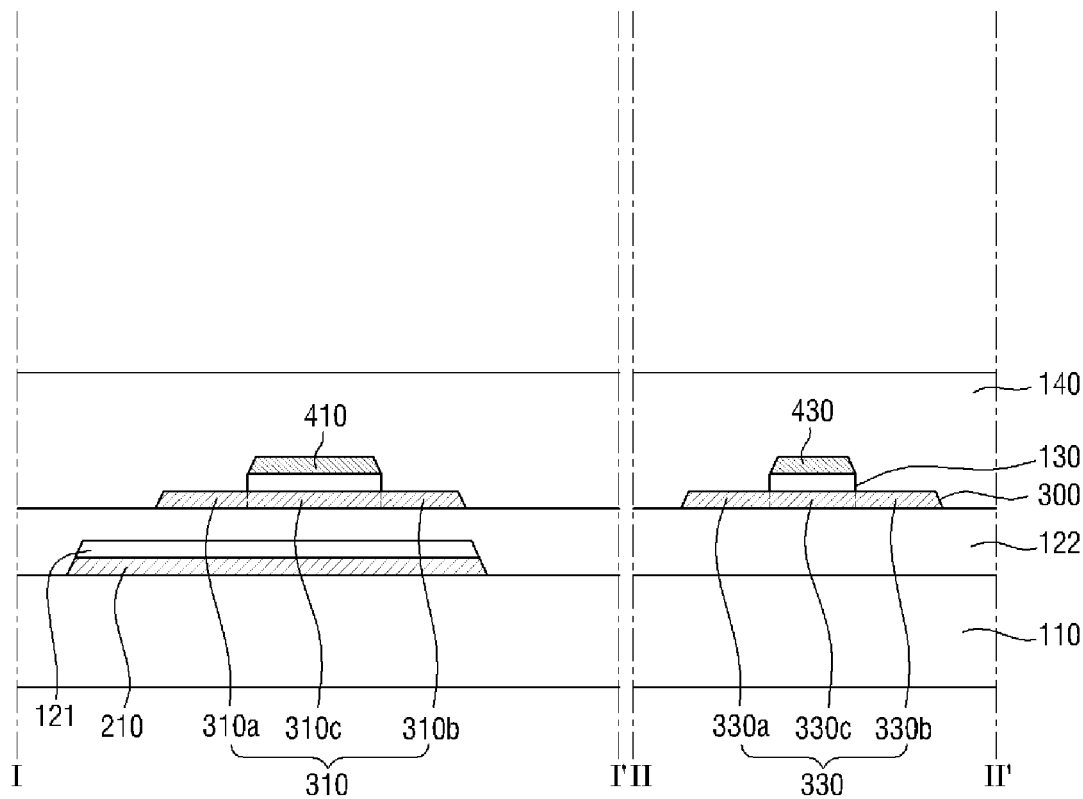

Referring to FIG. 14, a second insulation layer 140 may be formed on the second conductive layer 400. Before forming the second insulation layer 140, a partial area of the first semiconductor layer 310 may be made conductive to form a first conductive area 310a, a second conductive area 310b, and a channel area 310c. Further, a partial area of the second semiconductor layer 330 may be made conductive to form a first conductive area 330a, a second conductive area 330b, and a channel area 330c. The second insulation layer 140 may be partially etched in a subsequent process to include a contact hole that may partially expose the conductive layer disposed thereunder.

Figure 15:
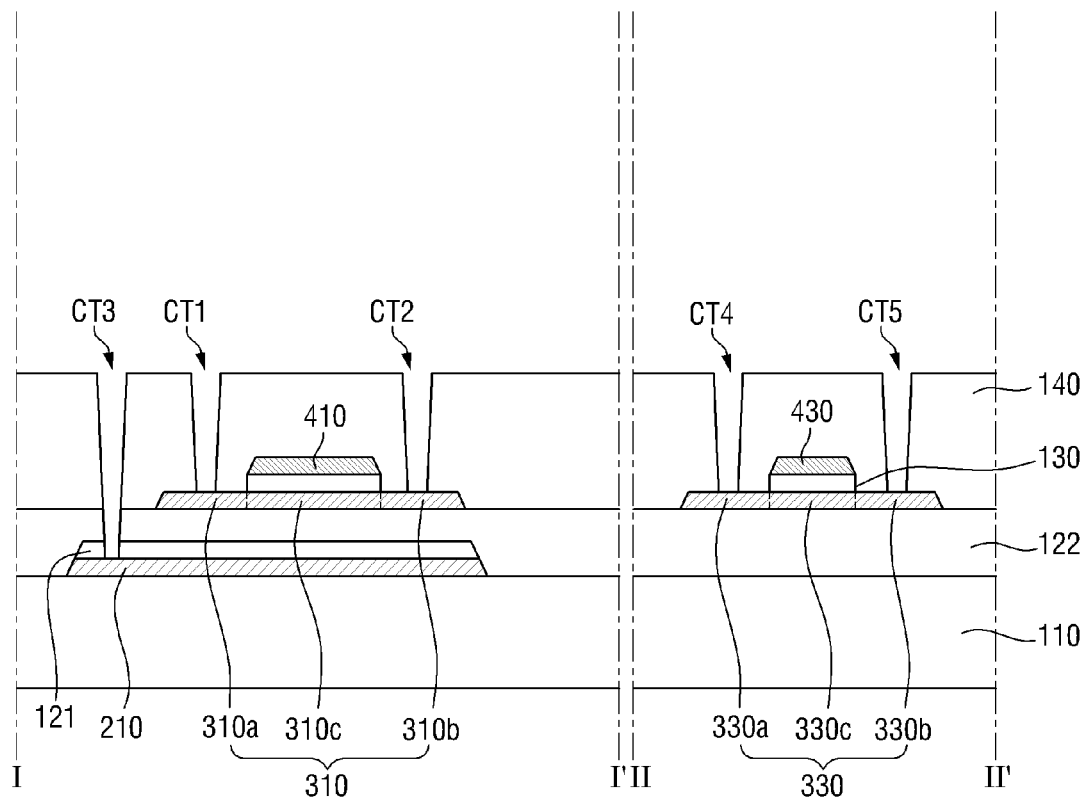
Figure 15:
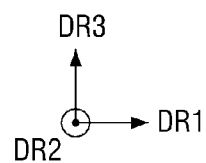

Referring to FIG. 15, contact holes CT1, CT2, CT3, CT4, and CT5 may be formed in the second insulation layer 140. The first contact hole CT1 may expose an upper surface of the first conductive area 310a of the first semiconductor layer 310 through the second insulation layer 140. The second contact hole CT2 may expose an upper surface of the second conductive area 310b of the first semiconductor layer 310 through the second insulation layer 140. The third contact hole CT3 may expose an upper surface of the light blocking layer 210 through the second insulation layer 140, the second buffer layer 122, and the first buffer layer 121. The fourth contact hole CT4 may expose an upper surface of the first conductive area 330a of the second semiconductor layer 330 through the second insulation layer 140. The fifth contact hole CT5 may expose an upper surface of the second conductive area 330b of the second semiconductor layer 330 through the second insulation layer 140.

Figure 16:
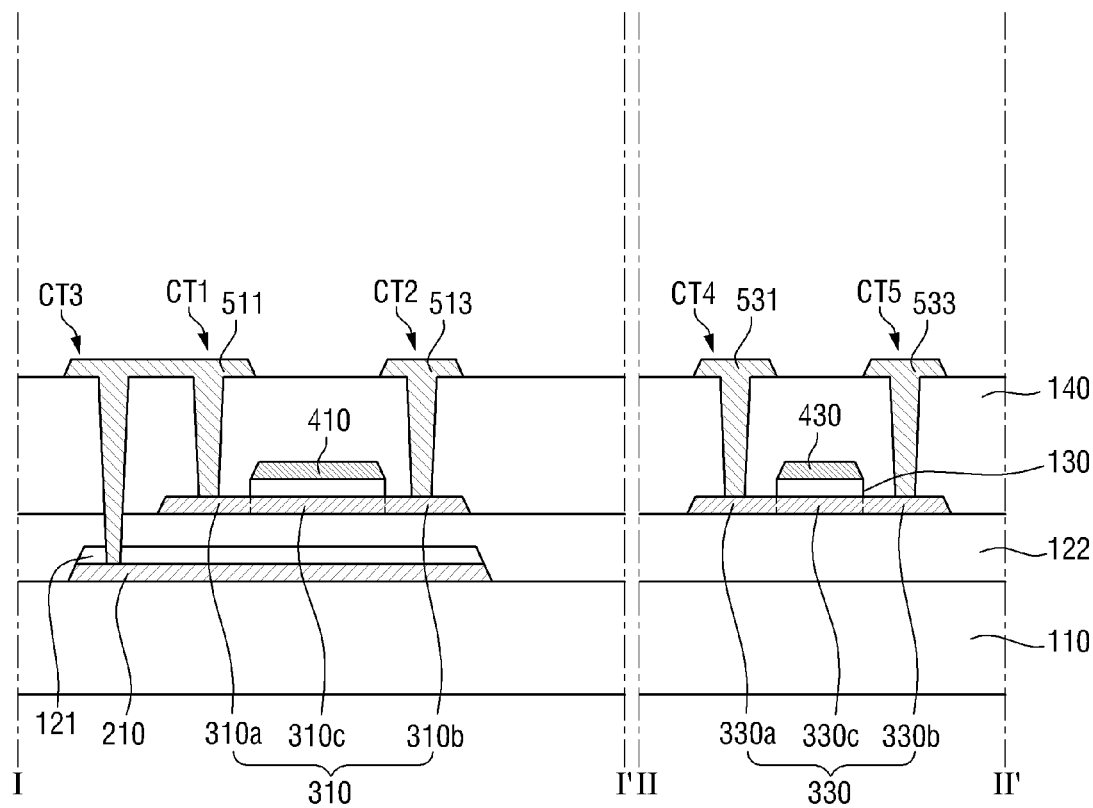

Referring to FIG. 16, a third conductive layer 500 may be formed on the second insulation layer 140. The third conductive layer 500 may include a first source electrode 511, a first drain electrode 513, a second source electrode 531, and a second drain electrode 533. The first source electrode 511, the first drain electrode 513, the second source electrode 531, and the second drain electrode 533 may be formed by patterning a metal layer formed by a sputtering method using an etching process using a photoresist pattern, but methods are not limited thereto.

The first source electrode 511 may come into contact with the first conductive area 310a of the first semiconductor layer 310 through the first contact hole CT1, and the first source electrode 511 may come into contact with the light blocking layer 210 through the third contact hole CT3.

The first drain electrode 513 may come into contact with the second conductive area 310b of the first semiconductor layer 310 through the second contact hole CT2.

The second source electrode 531 may come into contact with the first conductive area 330a of the second semiconductor layer 330 through the fourth contact hole CT4.

The second drain electrode 533 may come into contact with the second conductive area 330b of the second semiconductor layer 330 through the fifth contact hole CT5.

Figure 17:
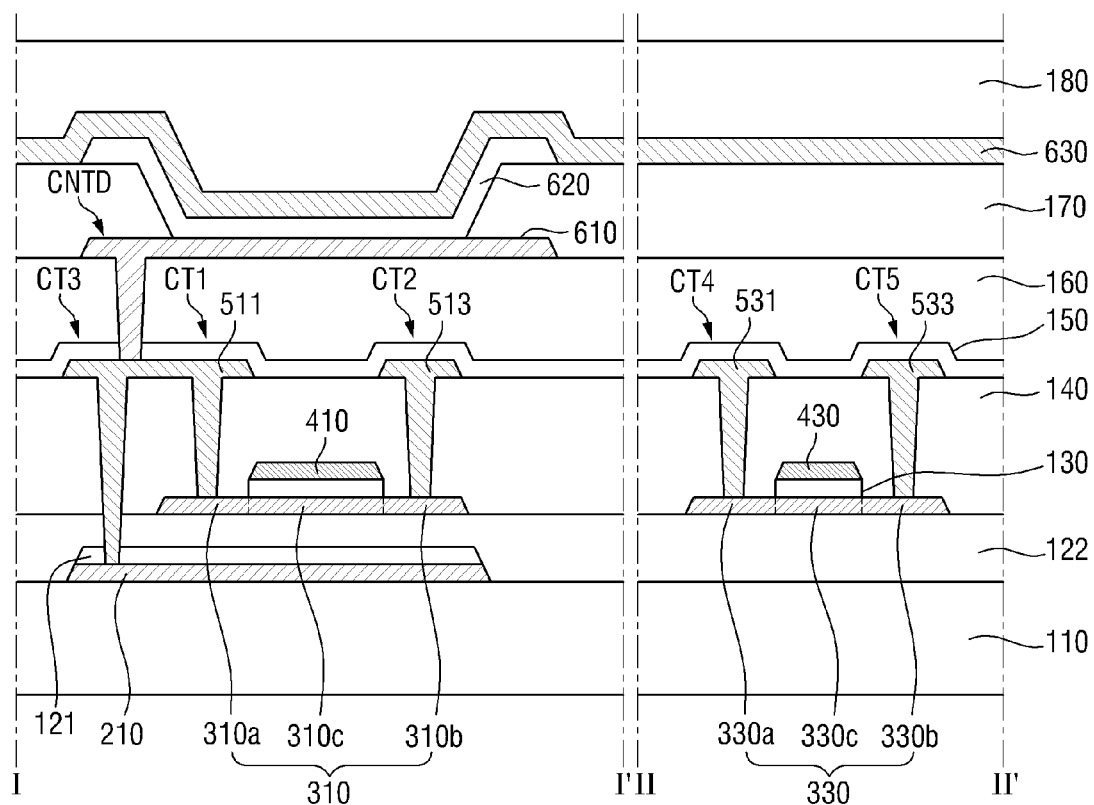
Figure 17:
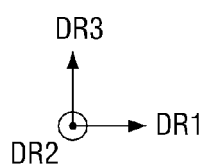

Referring to FIG. 17, a first passivation layer 150 and a third insulation layer 160 may be formed on the third conductive layer 500. An electrode contact hole CNTD that may expose the first source electrode 511 may be formed in the third insulation layer 160, and a first electrode 610 may be formed on the third insulation layer 160. The first electrode 610 may come into contact with the first source electrode 511 through the electrode contact hole CNTD. Subsequently, the display device 1 may be manufactured by forming a light emitting layer 620, a pixel definition layer 170, a second electrode 630, and an encapsulation layer 180 on the first electrode 610. Since descriptions of the structure may be the same as described above, detailed descriptions thereof may be omitted.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
   a pixel including a light emitting element connected to a scan line and a data line which crosses the scan line;
   a driving transistor that controls a driving current supplied to the light emitting element according to a data voltage applied from the data line, the driving transistor including:
      a first semiconductor layer; and
      a first gate electrode disposed on the first semiconductor layer;
   a switching transistor that applies the data voltage to the driving transistor according to a scan signal applied to the scan line, the switching transistor including:
      a second semiconductor layer; and
      a second gate electrode disposed on the second semiconductor layer,
   a light blocking layer and a first buffer layer disposed at a lower portion of the driving transistor,
   wherein the light blocking layer and the first buffer layer do not overlap the switching transistor.

2. The display device of claim 1, wherein a side surface of the light blocking layer and a side surface of the first buffer layer are aligned.

3. The display device of claim 1, wherein a width of the light blocking layer and a width of the first buffer layer are substantially the same.

4. The display device of claim 1, further comprising an insulation layer disposed on the first gate electrode and the second gate electrode,
   wherein the driving transistor includes a first source electrode and a first drain electrode disposed on the insulation layer, and
   the first source electrode is electrically connected to the light blocking layer.

5. The display device of claim 4, wherein the first source electrode contacts the light blocking layer through a contact hole passing through the insulation layer and the first buffer layer.

6. The display device of claim 4, wherein
   the switching transistor includes a second source electrode and a second drain electrode disposed on the second gate electrode; and
   the first source electrode and the second source electrode are disposed in a same layer.

7. The display device of claim 6, wherein
   the first semiconductor layer includes a first conductive area, a second conductive area, and a channel area disposed between the first conductive area and the second conductive area;
   the first source electrode contacts the first conductive area through a first contact hole passing through the insulation layer; and
   the first drain electrode contacts the second conductive area through a second contact hole passing through the insulation layer.

8. The display device of claim 1, wherein the first buffer layer overlaps the first semiconductor layer, and does not overlap the second semiconductor layer.

9. The display device of claim 1, wherein the first semiconductor layer and the second semiconductor layer includes at least one selected from the group consisting of indium (In), gallium (Ga), zinc (Zn), tin (Sn), and hafnium (Hf).

10. The display device of claim 1, further comprising a second buffer layer disposed on the first buffer layer,
    wherein the second buffer layer is continuously disposed at lower portions of the driving transistor and the switching transistor.

11. The display device of claim 10, wherein a hydrogen content of the first buffer layer is higher than a hydrogen content of the second buffer layer.

12. A display device comprising:
a substrate including a display area and a non-display area;
a light blocking layer disposed in the display area of the substrate;
a first buffer layer disposed on the light blocking layer;
a second buffer layer disposed on the first buffer layer;
a first semiconductor layer and a second semiconductor layer disposed on the second buffer layer;
a first gate electrode disposed on the first semiconductor layer; and
a second gate electrode disposed on the second semiconductor layer,
wherein the light blocking layer and the first buffer layer overlap the first semiconductor layer, and do not overlap the second semiconductor layer.

13. The display device of claim 12, wherein a side surface of the light blocking layer and a side surface of the first buffer layer are aligned.

14. The display device of claim 13, wherein the second buffer layer contacts the side surface of the light blocking layer and the side surface of the first buffer layer.

15. The display device of claim 14, wherein the second buffer layer is continuously disposed on the substrate.

16. The display device of claim 12, wherein a hydrogen content of the first buffer layer is higher than a hydrogen content of the second buffer layer.

17. The display device of claim 12, wherein the first buffer layer includes at least one of a silicon nitride layer (SiNx) and a silicon oxynitride layer (SiON).

18. The display device of claim 12, wherein the second buffer layer includes a silicon oxide layer (SiOx).

19. The display device of claim 12, wherein the first semiconductor layer and the second semiconductor layer includes at least one selected from the group consisting of indium (In), gallium (Ga), zinc (Zn), tin (Sn), and hafnium (Hf).

20. The display device of claim 12, further comprising:
a first source electrode disposed on the first gate electrode; and
a second source electrode disposed on the second gate electrode,
wherein the first source electrode is electrically connected to the first semiconductor layer, and
the second source electrode is electrically connected to the second semiconductor layer.

21. The display device of claim 20, further comprising an insulation layer disposed on the first gate electrode and the second gate electrode, wherein
the first source electrode contacts a conductive area of the first semiconductor layer through a contact hole passing through the insulation layer,
the second source electrode contacts a conductive area of the second semiconductor layer through another contact hole passing through the insulation layer.

22. The display device of claim 20, wherein the first source electrode is electrically connected to the light blocking layer.

23. The display device of claim 22, wherein the first source electrode contacts the light blocking layer through a contact hole passing through the first buffer layer and the second buffer layer.

* * * * *